(12) United States Patent
Murakami

(10) Patent No.: US 7,577,012 B2
(45) Date of Patent: Aug. 18, 2009

(54) FERROELECTRIC MEMORY DEVICE, METHOD FOR DRIVING FERROELECTRIC MEMORY DEVICE, ELECTRONIC APPARATUS, AND METHOD FOR DRIVING ELECTRONIC APPARATUS

(75) Inventor: Yasuhiko Murakami, Suwa (JP)

(73) Assignee: Seiko Epson Corporation (JP)

( * ) Notice: Subject to any disclaimer, the term of this patent is extended or adjusted under 35 U.S.C. 154(b) by 96 days.

(21) Appl. No.: 11/782,174

(22) Filed: Jul. 24, 2007

(65) Prior Publication Data

US 2008/0025064 A1    Jan. 31, 2008

(30) Foreign Application Priority Data

Jul. 25, 2006    (JP) ............................ 2006-201931

(51) Int. Cl.
 *G11C 11/22* (2006.01)
 *H03K 19/003* (2006.01)
 *G06F 11/08* (2006.01)
(52) U.S. Cl. ......................... 365/145; 326/11; 714/797
(58) Field of Classification Search ................ 365/145; 326/11; 714/797
See application file for complete search history.

(56) References Cited

U.S. PATENT DOCUMENTS

| 6,118,603 | A | * | 9/2000 | Wilson et al. .................. 360/48 |
| 7,248,514 | B2 | | 7/2007 | Nishihara et al. |
| 7,385,863 | B2 | | 6/2008 | Nishihara et al. |
| 2004/0216027 | A1 | * | 10/2004 | Ueno .......................... 714/758 |
| 2008/0077824 | A1 | * | 3/2008 | Mudge et al. .................. 714/42 |
| 2008/0184057 | A1 | * | 7/2008 | Thorp et al. ................... 714/1 |
| 2008/0184065 | A1 | * | 7/2008 | Thorp et al. ................... 714/6 |

FOREIGN PATENT DOCUMENTS

| JP | 62-017852 | 1/1987 |
| JP | 63-049860 | 3/1998 |
| JP | 2004-241097 | 8/2004 |

* cited by examiner

*Primary Examiner*—Ly D Pham
(74) *Attorney, Agent, or Firm*—Harness, Dickey & Pierce, P.L.C.

(57) ABSTRACT

A ferroelectric memory device includes: an odd number of memory regions, the odd number being at least three or higher; a readout circuit that reads data of 0 or 1 stored in the odd number of memory regions; a comparison circuit that compares readout data at corresponding addresses of the odd number of memory regions, and decides comparison data of 0 or 1 according to voting; and a write circuit that writes the comparison data in one region in the odd number of memory regions.

7 Claims, 4 Drawing Sheets

FERROELECTRIC MEMORY DEVICE, METHOD FOR DRIVING FERROELECTRIC MEMORY DEVICE, ELECTRONIC APPARATUS, AND METHOD FOR DRIVING ELECTRONIC APPARATUS

The entire disclosure of Japanese Patent Application No. 2006-201931, filed Jul. 25, 2006 is expressly incorporated by reference herein.

BACKGROUND

1. Technical Field

The present invention relates to a ferroelectric memory device, and an electronic apparatus and a driving method using the ferroelectric memory device.

2. Related Art

Japanese Laid-open Patent Application JP-A-2004-241097 describes a ferroelectric memory and its initialization method. The aforementioned document describes a method for improving depolarization of a ferroelectric capacitor which occurs due to thermal history during packaging, in which one cycle of a reference plate line is driven only at the time of first power-on.

A ferroelectric memory (FeRAM: Ferroelectric Random Access Memory) device stores information, using its hysteresis characteristic observed between polarization of the ferroelectric material and electric field. Ferroelectric memories are attracting attention in view of their high speed operation, low power consumption and nonvolatility, and are being studied for their application to various devices. For example, a microcomputer (micro-computer) may be provided with a program region (ROM (read only memory) region) and a RAM (random access memory) region; and as a ferroelectric memory is non-volatile and its data is re-writable, both of the regions can be formed from ferroelectric memories.

On the other hand, when a packaged ferroelectric memory (semiconductor chip) is assembled in an electronic apparatus, for example, when it is mounted on a wiring substrate composing the electronic apparatus with solder or the like, a thermal load (heat stress) of about 260° C. would be applied to the ferroelectric memory.

When such a thermal load is applied, the polarization state of the ferroelectric film would be depolarized. Therefore, according to the document described above, the depolarization is improved by driving a reference plate line by one cycle at the time of first power-on.

However, when the depolarization is excessive, in other words, when the depolarization occurs to the extent that previously written data becomes inverted, its relief is not possible even by using the technique described in the aforementioned document.

SUMMARY

In accordance with an advantage of some aspects of the invention, even when data written in a program region of a ferroelectric memory device is depolarized, it is possible to relieve the data. Also, by relieving data written in the program region, characteristics of the ferroelectric memory device and an electronic apparatus using the same can be improved.

(1) A ferroelectric memory device in accordance with an embodiment of the invention includes: an odd number of memory regions, the odd number being at least three or higher; a read-out circuit that reads out data of 0 or 1 stored in the odd number of memory regions; a comparison circuit that compares readout data at corresponding addresses of the odd number of memory regions, and decides comparison data of 0 or 1 according to voting; and a write circuit that writes the comparison data in one region in the odd number of memory regions.

According to the structure described above, by storing identical programs in the odd number of memory regions, readout data at corresponding addresses of the odd number of memory regions can be compared with one another, comparison data of 0 or 1 can be decided according to voting, and the comparison data can be written back to a program region that is one region in the odd number of memory regions. Accordingly, even when data stored (written) in the program region has been depolarized, and thus a data failure (defective bit) has occurred, the data can be relieved, and the initial data can be used.

Preferably, the ferroelectric memory device may have a judgment circuit that judges as to whether or not the number of power-on events is one. By providing the judgment circuit in this manner, an operation to rewrite the program data at second power-on and thereafter can be prevented.

Preferably, the ferroelectric memory device may have a judgment circuit that judges as to whether or not the number of power-on events is one, and the comparison data is written in the one region only when the number of power-on is one. By this structure, an operation to rewrite the program data at second power-on and thereafter can be prevented.

Preferably, the odd number of memory regions may store identical programs. By this structure, the program can be backed-up. Preferably, the memory regions other than the one region may be used as rewritable regions. By this structure, the rewritable regions can be used to backup the program.

(2) An electronic apparatus in accordance with an embodiment of the invention includes the ferroelectric memory device described above. It is noted that the "electronic apparatus" refers to any apparatus in general that is equipped with a ferroelectric memory device in accordance with the invention and performs a specified function. The electronic apparatus is not limited to a specific structure, and may include devices that require memory devices, such as, for example, computer devices in general equipped with a ferroelectric memory device, cellular phones, PHS, PDA, electronic notepads, and IC cards.

(3) A method for driving a ferroelectric memory device in accordance with an embodiment of the invention includes: a first step of storing a first program composed of 0 or 1 in an odd number of memory regions, the odd number being at least three or higher; and a second step of reading data at corresponding addresses of the odd number of memory regions, comparing the data readout, deciding comparison data of 0 or 1 according to voting, and writing the comparison data to one region in the odd number of memory regions.

According to the method described above, even when data stored (written) in the program region has been depolarized, and thus a data failure (defective bit) has occurred, the data can be relieved, and the initial data can be rewritten.

For example, a thermal load may be applied between the first step and the second step. According to this method, even when a data failure has occurred due to such a thermal load, the data can be relieved, and the initial program can be rewritten.

Preferably, the method may include a third step of writing desired data to the memory regions other than the one region. By this method, the program can be backed up by using the rewritable region.

(4) A method for driving an electronic apparatus in accordance with an embodiment of the invention includes the method for driving a ferroelectric memory device described above. By this method, the initial program can be rewritten in the program region at first power-on of the electronic apparatus.

(5) An electronic apparatus in accordance with an embodiment of the invention pertains to an electronic apparatus incorporating a ferroelectric memory device including an odd number of memory regions, the odd number being at least three or higher, each storing a first program composed of 0 or 1, wherein data at corresponding addresses of the odd number of memory regions are readout at first power-on, the read data are compared, comparison data of 0 or 1 is decided according to voting, and the comparison data is written in one region in the odd number of memory regions.

According to the structure described above, even when data stored (written) in the program region has been depolarized, and thus a data failure (defective bit) has occurred, the data can be relieved at first power-on of the electronic apparatus, and the initial program can be rewritten.

For example, a thermal load may be applied when the ferroelectric memory device is incorporated in the electronic apparatus. According to this structure, even when a data failure has occurred due to such thermal load, the data can be relieved, and the initial program can be rewritten.

BRIEF DESCRIPTION OF THE DRAWINGS

FIG. 4 is a timing chart of the circuit shown in FIG. 2 at the time of first power-on.

DESCRIPTION OF EXEMPLARY EMBODIMENTS

An embodiment of the invention is described below with reference to the accompanying drawings. However, the embodiment below does not limit the invention pertaining to the scope of claimed invention. Also, not all of the combinations of characteristics described in the embodiments may be indispensable for solutions provided by the invention.

Figure 1:
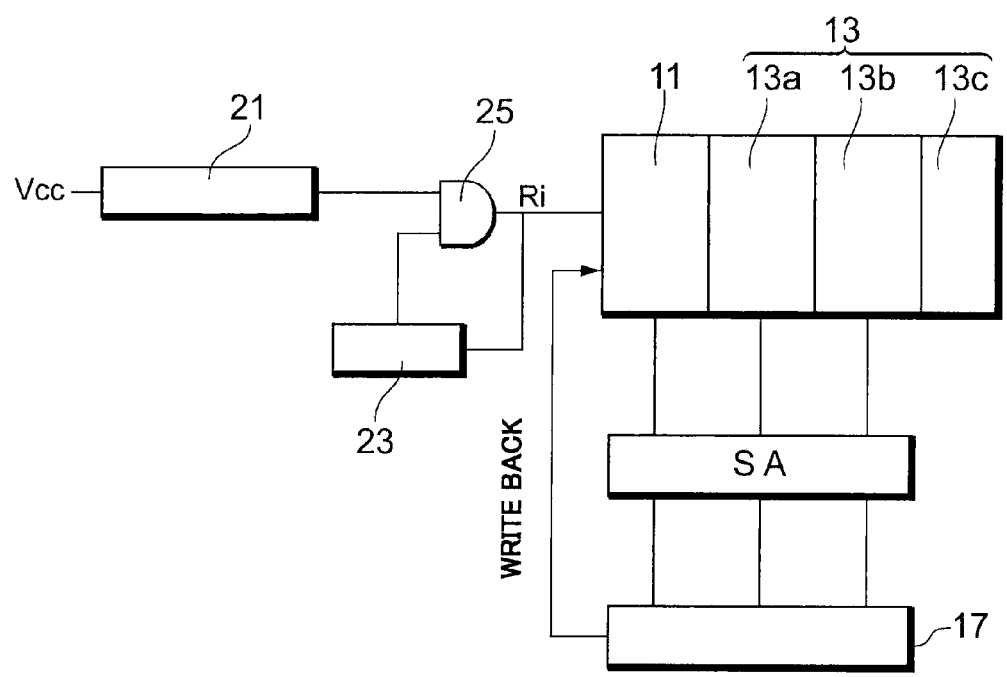
FIG. 1 is a block diagram showing a structure of a ferroelectric memory in accordance with an embodiment of the invention.

FIG. 1 is a block diagram of a structure of a ferroelectric memory (a ferroelectric storage device, a ferroelectric memory device) in accordance with an embodiment of the invention. As shown in the figure, the ferroelectric memory in accordance with the present embodiment includes a program region 11 and a RAM region 13, wherein the RAM region 13 includes a first RAM region 13a, a second RAM region 13b and a third RAM region 13c. Non-rewritable data such as security data and the like (hereafter referred to as "initial program data") is stored in advance in the program region 11 at the time of shipping of the ferroelectric memory.

For example, after forming semiconductor memory devices each composed of ferroelectric memory cells and transistors composing peripheral circuits on a semiconductor wafer, the wafer is diced (cut into individual pieces), thereby forming a plurality of semiconductor chips. The chips are individually sealed with sealing resin or the like, while exposing their lead electrodes and bump electrodes. For example, in the test step after sealing, the initial program data is written in the memory through the lead electrodes and the bump electrodes.

Such memories (memory devices) are manufactured in the manner described above by, for example, a semiconductor manufacturer, and shipped out. Further, such memories are purchased by, for example, an electronic apparatus manufacturer, and mounted on wiring substrates composing electronic apparatuses with melted resin or solder. In this instance, thermal load may often be applied to the memories. For example, in the case of bonding with solder, a thermal load of about 260° C., the melting temperature of solder, is applied.

Consequently, the initial program data written (stored) to the ferroelectric memory cell is depolarized by the thermal load. When the depolarization is extreme, in other words, when the depolarization occurs to the extent that the previously written data becomes inverted, they become defective bits. Accordingly, when a desired process is to be conducted according to the initial program data, wrong data is readout, which leads to malfunction.

Accordingly, in the present embodiment, the initial program data are also stored in the first RAM region 13a and the second RAM region 13b. Therefore, at the time of shipment, the program region 11, the first RAM region 13a and the second RAM region 13b (three memory regions, i.e., an odd number of memory regions) store the same program. In other words, a backup is made. It is noted however that the first RAM region 13a and the second RAM region 13b are a part of the RAM region 13, and the RAM region 13 is a region that is used by the end user as a rewritable region (an over-writable region).

Then, the ferroelectric memory is incorporated in an electronic apparatus, and delivered to the end user (purchaser of the electronic apparatus). At this time, at first power-on of the electronic apparatus (ferroelectric memory), a power source potential Vcc is inputted in a reset circuit 21 shown in FIG. 1, and a read-out signal Ri is composed (generated) by an output of the reset circuit 21 and a signal from a counter 23. For example, a signal at H level from the reset circuit 21 is inputted in a first input section of an AND circuit 25 and a signal at H level from the counter 23 is inputted in a second input section of the AND circuit 25, and the AND circuit 25 provides an output at H level as the read-out signal Ri.

In response to the read-out signal Ri, data at corresponding addresses in the memory regions of the program region 11, the first RAM region 13a and the second RAM region 13b are readout through a sense amplifier (read-out circuit) SA, and the data are compared by a comparator circuit 17, whereby comparison data (rewrite data) of 0 or 1 is decided according to voting. The comparison data is rewritten (written back) to the program region 11.

In this manner, in accordance with the present embodiment, even when data that was recorded (written) to the program region has been depolarized by the thermal load or the like at mounting process, and a data failure (defective bit) has occurred, the data can be relieved by the rewriting, and the initial program can be used.

It is noted that the read-out signal Ri is also inputted in the counter (judgment circuit) 23, and the counter is advanced by one. As a result, the counter 23 outputs a signal at L level at the time of second power-on (power starting) and thereafter, and the read-out signal Ri becomes L level, whereby the rewriting operation is prohibited. It is noted that the prohibition of rewriting operation at the time of second power-on and thereafter may be achieved by a circuit with a structure other than the above. In short, what is required is to judge as to whether or not the number of power-on events is one (first time or not), and rewrite the program data only when the number of power-on events is one.

Also, necessary data is overwritten by the end user to the first RAM region 13a and the second RAM region 13b (the RAM region 13). In other words, they are used as rewritable RAM regions.

Figure 2:
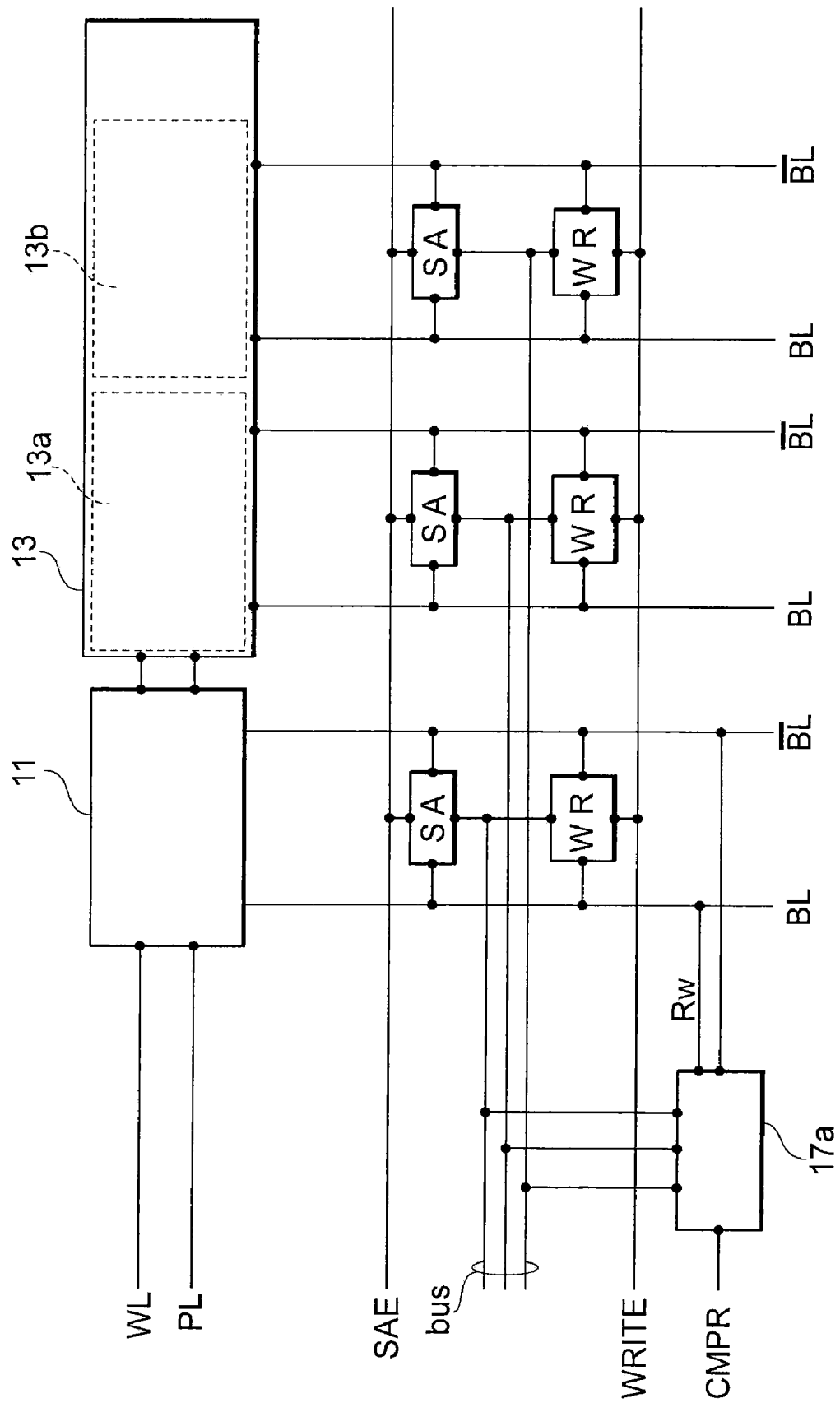
FIG. 2 is a block diagram showing in greater detail the structure of the ferroelectric memory in accordance with the embodiment of the invention.
Figure 3:
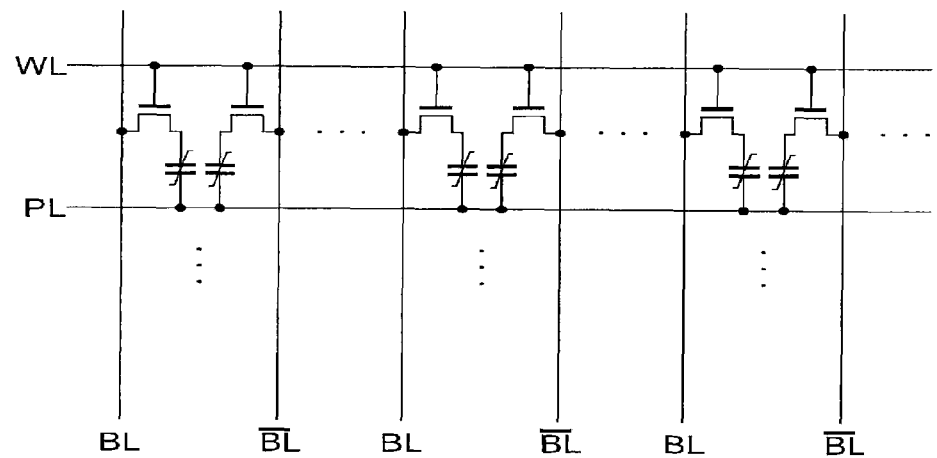
FIG. 3 is a circuit diagram of 2T2C cells.

FIG. 2 is a block diagram showing in greater detail the structure of the ferroelectric memory in accordance with the embodiment of the invention. As shown in the figure, the program region 11, the first RAM region 13a and the second RAM region 13b of the ferroelectric memory of the present embodiment are connected with a word line WL, a plate line PL, and bit lines BL and /BL, and memory cells are disposed at intersections of the word line WL and the bit lines BL. It is noted that the memory cell is a so-called 2T2C cell. In other words, each memory cell is composed of two transistors and two ferroelectric capacitors. FIG. 3 shows a circuit diagram of 2T2C cells.

As shown in FIG. 3, a bit line pair (BL, /BL) is connected to one ends of the two transistors composing each cell, and a sense amplifier SA is connected between the bit lines (see FIG. 2).

As shown in FIG. 2, the sense amplifier SA has an input section connected to a signal line SAE, and operates based on the SAE signal. It is noted that, in the following description, the same signs are used for a signal line name and its signal name. Also, output sections of the sense amplifiers SA are connected to signal lines, respectively, and the signal lines compose a bus (bus). In this case, three signal lines compose a bus (bus). It is noted that, in the case of a higher bit number, a CMPR dedicated bus may be divided from the ordinary memory operation bus. Outputs from the sense amplifiers SA are coupled through the bus (bus) to a voting circuit 17a. Also, the voting circuit 17a is connected to a signal line CMPR, driven by a signal CMPR, and outputs a rewrite signal Rw. Therefore, the voting circuit 17a is connected to the bit lines BL and /BL in the program region 11 through the signal line Rw. FIG. 2 shows only one bit line pair (1 bit) for each of the regions, but a plurality of bit lines may be required depending on the memory capacity.

Also, write circuits WR are connected between the bit lines, respectively. The ferroelectric memory performs a so-called destructive readout. Therefore, after readout, the read-out data is rewritten by the write circuit WR, whereby the data is maintained. It is noted that the write circuits WR may be used to rewrite (overwrite) data. For example, by designating a non-rewritable address in advance, a program region may be defined. In other words, a region whose address is designated as non-rewritable is prohibited from rewriting data, and defines a program region. A region whose address is designated as rewritable defines a RAM region where data can be rewritten.

Figure 4:
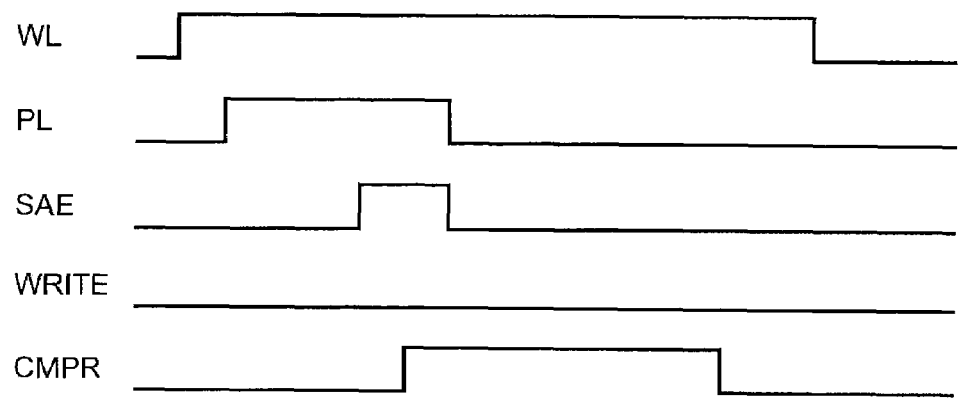

FIG. 4 is a timing chart of the circuit shown in FIG. 2 at first power-one. As shown in the figure, when the potentials on the word line WL and the plate line PL rise (i.e., change from L level to H level, become activated, assume an on-state), a charge (data, 1 or 0) retained at the ferroelectric capacitor appears on the bit line BL. Then, when the signal SAE rises, the sense amplifier SA operates, and data (1 or 0) written in the memory cell is readout. By the steps described above, data at corresponding addresses of the memory regions of the first RAM region 13a and the second RAM region 13b are read-out.

Then, when the signal CMPR rises, comparison data (rewrite data) of 0 or 1 decided by the voting circuit 17a is written through the bit line to the program region 11. In this case, the voting circuit 17a has a function to compare the readout data, a function to decide comparison data by voting, and a function to write data to the program region 11. It is noted that the write circuit WR connected to the program region 11 may be used to perform the writing operation. However, by inputting the as-outputted Rw of the voting circuit 17a to the bit line, the as-outputted logic of the voting circuit 17a can be written to the program region 11, such that the program data can be rewritten with a simpler structure, while reducing error inputs. It is noted that, in this instance, the write signal (the drive signal to drive the write circuit WR) remains at L level, and does not rise. Since the first RAM region 13a and the second RAM region 13b are thereafter used by the end user as rewritable regions, rewriting does not need to be conducted.

It is noted that, as the signal CMPR, the readout signal Ri described above with reference to FIG. 1 or a signal corresponding to the readout signal Ri may be used.

In view of the above, in accordance with the present embodiment, it can be said that, by utilizing the characteristics of a ferroelectric memory that is nonvolatile but rewritable, the program region 11 that is inherently a non-rewritable region is permitted to rewrite only once. The timing of the rewriting operation is set at the first power-on, and a backup of an even number of program data, the even number being at least two or more, is prepared in the RAM region 13 that is a rewritable region, in other words, an odd number of program data (an odd number of memory regions) including the original program and its backup programs are prepared, whereby voting becomes possible, and the program data is recovered (rewritten) according to voting. In this manner, the program data is compensated, and thereafter the RAM region is used as a rewritable region, whereby the memory can be effectively utilized.

Figure 5:
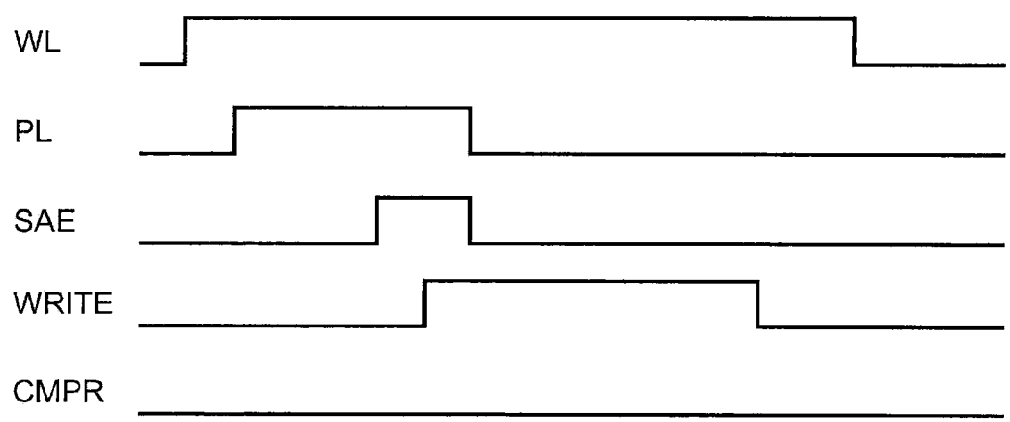
FIG. 5 is a timing chart of the circuit shown in FIG. 2 at the time of read-out (excluding the first power-on).

On the other hand, the program data (data in the program region 11) and the data in the ROM region 13 are readout in the following manner. FIG. 5 is a timing chart of the circuit shown in FIG. 2 at the time of readout (excluding the first power-on). First, when the potentials on the word line WL and the plate line PL rise (i.e., change from L level to H level), the charge retained at the ferroelectric capacitor appears on the bit line BL. Then, when the signal SAE rises, the sense amplifier SA operates, and the data (1 or 0) written to the memory cell is readout. The ferroelectric memory performs a so-called destructive readout. Therefore, the as-readout data is rewritten by the write circuit WR, whereby the data is maintained. It is noted that, at this time, the signal CMPR remains at L level, and does not rise. Therefore, the data is not rewritten to the program region 11.

In this manner, in accordance with the present embodiment, even when depolarization of data written in the program region of the ferroelectric memory (data failure) occurs, the data can be relieved. Also, by relieving the data written to the program region, the characteristics of the ferroelectric memory device and an electronic apparatus using the same can be improved.

It is noted that, in the present embodiment, a 2T2C memory cell is described as an example, but the present embodiment is not limited to a particular structure, and is also applicable to a 1T1C memory cell, in other words, a memory cell that uses a sense amplifier to amplify a difference between a potential readout from a ferroelectric capacitor and a reference potential to thereby readout data.

Also, in accordance with the present embodiment, programs are backed up in two RAM regions (13a and 13b). However, it is also possible to divide a RAM region or a part thereof to provide an odd number of regions including the original program region. Accordingly, among the divided RAM regions, program data is backed up in an even number of regions. In essence, what is required is to compare data in the odd number of memory regions including the program region, and write back the comparison data to one of the regions in these memory regions.

Also, in accordance with the present embodiment, the backup is performed with two RAM regions (13a and 13b). However, the more the regions, the better the reproducibility of the program data becomes. However, it is not necessary to divide a RAM region as much as practically possible for backup. In other words, a region among the RAM region which is not used for backup (for example, 13c) may remain with a volume greater than the program volume.

Also, in the present embodiment, the program region and the RAM regions (13a and 13b) are provided. However, these regions do not need to be formed apparently isolated from one another.

Also, the present embodiment is described assuming that the end user performs the first power-on. However, the first power-on may be performed as a test by a device (electronic apparatus) manufacturer, or may be conducted at a retail shop.

Further, in the present embodiment, the mounting step by solder welding is described as an example of a thermal load. However, a thermal load could be applied not only in the mounting step, but also at the time of an accelerated test on the memory. Also, program data (including its backup) may be written in the state of a wafer. Also, a thermal load could be applied in the state of a bare chip. Also, in the present embodiment, the thermal load applied at the time of mounting step conducted by an electronic apparatus manufacturer is described as an example. However, a thermal load could be applied by a semiconductor manufacturer, or a component manufacturer where memories are assembled in components. In essence, what is required is to be able to cope with thermal loads applied after programming (backing up) in a plurality of memory regions.

Also, in accordance with the present embodiment, the thermal load generated at the time of mounting step conducted by an electronic apparatus manufacturer is described as an example. However, it is not necessary that the thermal load needs to be applied. After shipping of memories, the memories may possibly be incorporated in electronic apparatuses by a variety of processes, and it also makes sense at the processing if the restriction on thermal load is alleviated. In other words, it makes sense if the program data can be relieved even when a thermal load is applied.

Also, in the present embodiment, the ferroelectric memory is described as an example. However, in addition, the embodiment is widely applicable to memory devices having a program region and a RAM region formed with nonvolatile memories. However, the invention is favorably applied to ferroelectric memories, as the ferroelectric memories are greatly influenced by depolarization by heat.

The embodiment examples and application examples described above with reference to the embodiments of the invention can be used through being appropriately combined, modified or improved according to the intended usage, and the invention is not limited to the description of the embodiments described above.

What is claimed is:

1. A ferroelectric memory device comprising:
    an odd number of memory regions, the odd number being at least three or higher;
    a read-out circuit that reads data of 0 or 1 stored in the odd number of memory regions;
    a comparison circuit that compares readout data at corresponding addresses of the odd number of memory regions, and decides comparison data of 0 or 1 according to voting;
    a write circuit that writes the comparison data in one region in the odd number of memory regions; and
    a judgment circuit that judges as to whether or not the number of power-on events is one.

2. A ferroelectric memory device according to claim 1, wherein the comparison data is written in the one region, only when the number of power-on is one.

3. A ferroelectric memory device according to claim 1, wherein the odd number of memory regions store identical programs.

4. A ferroelectric memory device according to claim 1, wherein the memory regions other than the one region are used as rewritable regions.

5. A method for driving a ferroelectric memory device, the method comprising the steps of:
    (1) storing a first program composed of 0 or 1 in an odd number of memory regions, the odd number being at least three or higher; and
    (2) reading data at corresponding addresses of the odd number of memory regions, comparing the data readout, deciding comparison data of 0 or 1 according to voting, and writing the comparison data to one region in the odd number of memory regions, wherein a thermal load is applied between the steps (1) and (2).

6. A method for driving a ferroelectric memory device according to claim 5, comprising the step of writing desired data in the memory regions other than the one region.

7. A method for driving an electronic apparatus comprising the method for driving a ferroelectric memory device recited in claim 5.

* * * * *